United States Patent
Delaunay et al.

(10) Patent No.: US 6,787,200 B1
(45) Date of Patent: Sep. 7, 2004

(54) METHOD AND DEVICE FOR ELECTRONIC CYCLOTRONIC RESONANCE PLASMA DEPOSIT OF CARBON NANOFIBRE LAYERS IN FABRIC FORM AND RESULTING FABRIC LAYERS

(75) Inventors: Marc Delaunay, Meylan (FR); Marie-Noëlle Semeria, Nizies du Novcherotte (FR)

(73) Assignee: Commissariat a l'Energie Atomique, Paris (FR)

(*) Notice: Subject to any disclaimer, the term of this patent is extended or adjusted under 35 U.S.C. 154(b) by 58 days.

(21) Appl. No.: 10/019,278
(22) PCT Filed: Jun. 29, 2000
(86) PCT No.: PCT/FR00/01827
§ 371 (c)(1),
(2), (4) Date: Jan. 2, 2002
(87) PCT Pub. No.: WO01/03158
PCT Pub. Date: Nov. 1, 2001

(30) Foreign Application Priority Data

Jul. 1, 1999 (FR) .............................................. 99/08473

(51) Int. Cl.$^7$ ....................... C23C 16/26; C23C 16/511; D01F 9/12; D01F 9/127
(52) U.S. Cl. ....................... 427/571; 427/573; 427/575; 427/577; 427/249.1; 423/445 B; 423/447.3; 118/723 MA
(58) Field of Search ................... 427/569, 571, 427/573, 575, 577, 77, 78, 249.1, 249.6, 255.23, 903, 180; 423/445 R, 445 B, 447.1, 447.3; 118/723 MR, 723 MA

(56) References Cited

U.S. PATENT DOCUMENTS 4,638,216 A * 1/1987 Delaunay et al. ....... 315/111.81
5,370,765 A * 12/1994 Dandl .......................... 216/69

(List continued on next page.)

FOREIGN PATENT DOCUMENTS

DE   197 40 389   3/1999
JP   06 322615    11/1994

(List continued on next page.)

OTHER PUBLICATIONS

A.Y. Tcherepanov et al, Flat Panel Displays Based Upon Low–Voltage Carbon FIeld Emitters, $7^{th}$ International Vacuum Microelectronics Conference, Jul. 1994, vol. 50, pp. 205–208.

(List continued on next page.)

Primary Examiner—Shrive P. Beck
Assistant Examiner—Wesley D Markham
(74) Attorney, Agent, or Firm—Oblon, Spivak, McClelland, Maier & Neustadt, P.C.

(57) ABSTRACT

Process and device for depositing, by electron cyclotron resonance plasma, a web of carbon nanofibres or nanotubes, on a substrate without a catalyst, by injection of a microwave power into a deposition chamber including a magnetic structure with a highly unbalanced magnetic mirror and at least one electron cyclotron resonance zone within the interior of the deposition chamber itself and opposite the substrate. Under a pressure of less than $10^{-4}$ mbar, ionization and/or dissociation of a gas containing carbon is induced in the magnetic mirror in the center of the deposition chamber, thus producing species that deposit on the substrate, which is heated. A resulting film, which may be on a substrate, can be formed from a web or a network of interconnected carbon nanofibres or nanotubes, like a spider's web, the film being exempt of a catalyst and a structure of several layers-a multi-layer structure-including at least two layers of a web of carbon nanofibres or nanotubes, as well as filters, electron accelerating or decelerating nano-grids and flat screens including such films or structures.

17 Claims, 4 Drawing Sheets

U.S. PATENT DOCUMENTS

| | | | | |
|---|---|---|---|---|
| 5,433,788 | A | * 7/1995 | Mochizuki et al. | 118/723 MR |
| 5,685,913 | A | * 11/1997 | Hirose et al. | 118/723 MA |
| 6,099,965 | A | * 8/2000 | Tennent et al. | 428/408 |
| 6,346,303 | B1 | * 2/2002 | Shih et al. | 427/571 |
| 6,420,092 | B1 | * 7/2002 | Yang et al. | 430/311 |
| 6,426,134 | B1 | * 7/2002 | Lavin et al. | 428/300.1 |
| 2004/0011291 | A1 | * 1/2004 | Delaunay et al. | 118/723 MA |

FOREIGN PATENT DOCUMENTS

| | | |
|---|---|---|
| JP | 09 188509 | 7/1997 |
| JP | 10 203810 | 8/1998 |
| JP | 11 011917 | 1/1999 |
| JP | 11 116218 | 4/1999 |
| JP | 11 162383 | 6/1999 |
| WO | 97 20620 | 6/1997 |
| WO | WO 98/39250 A1 * | 9/1998 |

OTHER PUBLICATIONS

D. Hong et al., Field Emission From P–Type Polycrystalline Diamond Films, 7$^{th}$ International Vacuum Microelectronics Conference, No. 271, Apr. 1994, pp. 96–99.

M. Delaunay et al, Electron Cyclotron Resonance Plasma Ion Source for Material Depositions, Review of Scientific Instruments, vol. 69, No. 6, Jun. 1998, pp. 2320–2324.

Seiichiro Matsumoto, Chemical Vapour Deposition of Diamond in RF Glow Discharge, Journal of Materials Science Letters 4, 1985, pp. 600–602.

Jean–Michel Le Corfec, La television du futur se met a plat, Physique Comprendre, Apr. 1998, p. 87.

Sumio Lijima, Helical Microtublues of Graphitic Carbon, Letters to Nature, vol. 354, Nov/ 7, 1991, pp. 56–58.

Olivier M. Kuteel, et al., Electron Field Emission From Phase Pure Nanotube Films Grown in a Methane/Hydorgen Plasma, Applied Physics Letters, vol. 73, No. 15, Oct. 12, 1998, pp. 2113–2115.

Z.P. Huang, et al., Growth of Highly Oriented Carbon Nanotubes by Plasma–Enhanced Hot Filament Chemical Vapor Deposition, Applied Letters, vol. 73. No. 26, Dec. 28, 1998, pp. 3845–3847.

Li Yunjun et al, Field Electron Emission From Highly Graphitic Diamond Films With Ball–Like Surface Morphologies, Technical Digest of International Vacuum Microeletronics Conference, Kyomgiu, Korea Aug. 1997, pp. 137–140.

W.Z. Li et al, Large–Scale Synthesis of Aligned Carbon Nanotubes, Reports, Science, vol. 274, Dec. 6, 1996, pp. 1701–1703.

M. Delaunay et al., Electron Cyclotron Resonance Plasma Ion Source For Material Depositions, Review of Scientific Instruments, vol. 69, No. 6, Jun. 1998, pp. 2320–2324.

Yahachi Saito et al., High Yield of SIngle–Wall Carbon Nanotubes by arc Discharging Using Rh–Pt Mixed Catalysts, Chemical Physics Letters vol. 294, Sep. 25, 1998, pp. 593–598.

S.P. Bozeman et al., Electron Field Emission From Amorphous Carbon–Cesium Alloys, J. Vac. Science Technol. A 15(3), May/Jun. 1997, pp. 1729–1732.

A.A. Talin et al., Electron Field Emission From Amorphous Tetrahedrally Bonded Carbon Films, J. Vac. Sci. Technol. A. 14(3), May/Jun. 1996, pp. 1719–1722.

Gehan A.J. Amaratunga et al., Nitrogen Containing Hydrogenated Amorphous Carbon for Thin–Film Emission Cathodes, Appl. Phys. Letters 68 (18), Apr. 29, 1996, p. 2529–2531.

B.S. Satyanarayana et al., Field Emission From Tetrahedral Amorphous Carbon, Appl. Phys. Letters. 71 (10), Sep. 8, 1997, pp. 1430–1432.

K. Kuramoto et al., High Quality Diamond Like Carbon Thin Film Fabricated by ECR Plasma CVD, Applied Surfaces Science 113/114 (1997), pp. 227–230.

W. Zhu et al, Defect–Enhanced Electron Field Emission From Chemical Vapor Depoisted Diamond. J. Appl. Phys. 78(4), Aug. 15, 1995, pp. 2707–2711.

Takuya Yara et la., Fabrication of Diamond Films at Low Pressure and Low–Temperature by Magneto–Active Microwave Plasma Chemical Vapor Deposition, Jpn. J. Appl. Phys. vol. 33 (1994) pp. 4404–4408.

C J Erickson et al., High–Sensitivity Abosorption Spectroscopy on a Microwave Plasma–Assisted Chemical Vapour Deposition Diamond Growth Facility, Plasma Sources Sci. Techno. 5 (1996) pp. 761–764.

Sl Sung et al.: "Well–aligned carbon nitride nanotubes syntesized in anodic alumina by electron cyclotron resonace chemical vapor deposition" Applied Physics Letters, vol. 74, No. 2, pp. 197–199, Jan. 11, 1999.

A. Thess et al.: "Crystalline ropes of metallic carbon nanotubes" Science, vol. 273, No. 5274, pp. 483–487, Jul. 26, 1996.

* cited by examiner 100 nm

METHOD AND DEVICE FOR ELECTRONIC CYCLOTRONIC RESONANCE PLASMA DEPOSIT OF CARBON NANOFIBRE LAYERS IN FABRIC FORM AND RESULTING FABRIC LAYERS

DISCUSSION OF THE BACKGROUND

FIELD OF THE INVENTION

The present invention concerns a process and a device for depositing, by electron cyclotron resonance plasma, films of carbon nanofibre webs.

In addition, the invention concerns the films of web obtained in this manner.

The technical field of the application may be defined, in a general manner, as that of depositing films of carbon on a substrate.

Such films are, in particular, films of carbon that emit electrons, but we have also sought to develop processes whose purpose is to synthesise films of diamond, and profitably employ the mechanical, optical and electrical properties of diamond at temperatures generally between 400° C. and 1,000° C., or in order to make DLC ("Diamond Like Carbon") type carbon films, generally at low temperature (20° C. to 400° C.) and with a high level of C—C sp3 bonding, in particular for their mechanical properties.

Such films are principally amorphous.

More precisely, the present application is particularly concerned with the preparation of carbon films formed of nanotubes or nanofibres.

BACKGROUND OF THE INVENTION

Table 1, at the end of the description, shows different devices and processes for depositing, under vacuum, carbon films, used mainly for depositing emissive carbon.

This table highlights two different categories of deposition processes.

The first category involves CVD processes ("Chemical Vapour Deposition") in which a gas of organic molecules (often methane) is introduced as a mixture, with or without hydrogen, into a device that enables the C—C, C–H and H—H bonds to be broken by electron impact with, for example, the use of a hot filament, the introduction of microwave power, the use of a radio frequency (RF) polarisation or the use of an electron cyclotron resonance (ECR).

Depending on the device used, the operating pressure is either high (filament, microwave, radio frequency) or low (ECR, RF). The result is a dissociation and an ionisation of the particles, which increases as the pressure decreases. The energy that needs to be supplied for the reaction that transforms the gas into a solid is considerably decreased by the breaking of the covalent bonds (for example $CH_4$) of organic molecules.

It is thus possible to obtain graphite or diamond type crystallised structures at lower substrate temperatures (for example, 400° C. instead of 800° C.). The polarisation of the substrate also makes it possible to favour crystallisation at lower temperature, thus enabling the use of a wider variety of substrates.

The second category of deposition processes groups together the processes, called PVD processes (Physical Vapour Deposition), which involve the direct deposition of carbon atoms or ions, which may be achieved by spraying a graphite target by arc, by laser ablation, by a beam of ions or by evaporation.

The quality and the structure of the films, at a given temperature, mainly depend on the energy of the incident carbon ions or atoms.

In the case of the preparation of carbon nanotube or nanofibre films, which is of particular interest to us, within the scope of the present application, the PVD and CVD processes described above are also used.

Document (18) "High yield of single-wall carbon nanotubes by arc discharge using Rh-Pt mixed catalysts", Y, Saito, Y. Tani, N. Miyagawa, K. Mitsushima, A. Kabuya, Y. Nishina (Chemical Physics Letters 294 (1998), Pages 593–598) and Document (19) "Helical microtubes of graphitic carbon" S. Iijima (Nature, vol. 354,6 Nov. 1991) pages 56 and 58) concern processes for producing carbon nanotubes by PVD processes, with a direct supply of C° carbon atoms by laser ablation or electric arc. Document (18) describes, more precisely, a process for preparing carbon nanotubes using evaporation by arc between two graphite electrodes in helium, at high pressure (50–1 520 torrs). Binary mixtures of metals from the platinum group, such as rhodium and platinum, are used as catalysts.

The object of document (19) is the synthesis of tube type carbon structures in the form of pins by evaporation by arc discharging with a carbon electrode, within an enclosure filled with argon at 100 torrs.

The nanotubes or nanofibres can also be prepared by CVD processes, via catalytic de-hydrogenation of organic molecules such as acetylene or methane.

The device used may be make use of hot filaments, a radio frequency system or the injection of microwaves at high pressure, which generates atomic hydrogen and radicals or ions, such as $CH_3^+$, $CH_3^0$, $CH^0$, etc.

However, it should be pointed out that forming truly organised architectures of carbon nanofibres or nanotubes and not random and unorganised deposits has been explored up to now.

Document (15) "Large-Scale Synthesis of Aligned Carbon Nanotubes", W. Z. Li, S. S. Xie, L. X. Qian, B. H. Chang, B. S. Zou, W. Y. Zhou, R. A. Zhao, G. Wang (Science, vol. 274–6. December 1996, pages 1 701–1703) describes the synthesis of aligned carbon nanotubes using a process based on PECVD (Plasma Enhanced Chemical Vapour Deposition) of carbon from the decomposition of acetylene from a gaseous mixture of acetylene and nitrogen, with the deposition being catalysed by microparticles of iron imprisoned within the porous silica that forms the substrate.

Images obtained by scanning electron microscope show that the nanotubes are markedly perpendicular to the surface of the silica and form rows of tubes separated from each other by around 50 micrometers length and spaces of around 100 manometers.

Document (16) "Growth of Highly oriented Carbon nanotubes by plasma-enhanced hot filament chemical vapour deposition, Z. P. Huang, J. W. Xu, Z. F. Ren, J. H. Wang, M. P. Siegal, P. N. Provencio (Applied Physics Letters, vol. 73, number 26,28 December 1998 pages 3845–3847) also describes the growth of orientated carbon nanotubes on monocrystalline and polycrystalline nickel substrates by the PECVD process, by using a hot filament. The carbon nanotubes have diameters of 10 to 500 nm and a length of 0.1 to 50 micrometers. Acetylene is used as the carbon source and ammonia is used as the diluting gas and for the catalysis.

"Electron Field emission from phase pure nanotube films grown in a methane/hydroen plasma, O. M. Kuttel, O.

Groening, Ch. Emmenegger, L. Schlapbuch (Applied Physics Letters, vol. 73, number 15,12 October 1998, pages 2 113–2 115) concerns the growth of films of carbon nanotubes on silicon substrates by CVD, from a mixture of methane and hydrogen, using a microwave plasma at a substrate temperature of 900° C. to 1 000° C. Iron or nickel is deposited, beforehand, on the substrate in order to act as a catalytic seed for growing the nanotubes.

None of the processes described above allow organised architectures of carbon nanofibres or nanotubes to be made with strong bonds between the tubes in order to form a spider's web (2D structure).

SUMMARY OF THE INVENTION

We have seen that the alignment of the nanofibres or nanotubes could certainly be obtained (15) (16), but that, unless particular precautions are taken, the carbon nanotubes often develop (17) in a random unorganised manner, in the form of a jumble of filaments or spike structures without C—C bonds between the tubes (1D structure).

Although attempts, aiming to develop interconnections, have been carried out (18) by adding nanograins of catalyst, one again obtains, in this case, a disordered and random structure without strong C—C bonds between the tubes.

In addition, none of the processes described above allow films of nanotubes to be prepared and, moreover, organised architectures of carbon nanofibres or nanotubes, such as webs of nanofibres or nanotubes directly from organic molecules and without a catalyst.

Finally none of the processes allows the deposition of nanofibres or nanotubes over a large surface, in other words generally greater than or equal to 1 $m^2$.

There is therefore a need for a process for depositing webs of carbon nanofibres or nanotubes, not requiring a catalyst, which allows the deposition of such nano-architectures over large areas at a relatively low temperature.

The aim of the present invention is thus to provide a process for depositing webs of carbon nanofibres or nanotubes that meets, amongst other things, all of the requirements mentioned above.

The aim of the present invention is also to provide a process for depositing webs of carbon nanofibres or nanotubes that does not have the disadvantages, defects and limitations of the processes of the prior art and which resolve the problems of the prior art.

This aim and others are achieved, according to the present invention, by a process for depositing a web of carbon nanofibres or nanotubes onto a substrate by electron cyclotron resonance plasma, in the absence of a catalyst, by the injection of a microwave power into a deposition chamber comprising a magnetic structure with a highly unbalanced magnetic mirror, and at least one electronic cyclotron resonance zone within the said deposition chamber and opposite the said substrate, in which, at a pressure less than $10^{-4}$ mbar, the ionisation and/or the dissociation of a gas containing carbon is induced in the said magnetic mirror at the centre of the deposition chamber, thus producing species that are deposited on the said substrate, which is heated.

More precisely, the said process comprises the following steps:

Heating the substrate

Establishing a pressure equal to or less than $10^{-4}$ mbar of a gas containing carbon Injecting microwave power, and creating a plasma from the said gas containing carbon, for a magnetic field value corresponding to the electron cyclotronic resonance Creating a potential difference between the plasma and the substrate Dissociating and/or ionising the molecules in the said magnetic mirror at the centre of the deposition chamber Depositing the species formed on the said substrate in order to obtain the webs of carbon nanofibres or nanotubes In a particularly advantageous embodiment of the invention, the steps are carried out at the same time.

In fact, the process according to the invention can be placed between the two extreme processes, namely PVD (Physical Vapour Deposition) and CVD (Chemical Vapour Deposition), and it constitutes an excellent compromise between these two techniques, without having any of the disadvantages.

The process according to the invention meets the requirements mentioned above and resolves the problems of the processes of the prior art and, in particular, unlike the processes for depositing nanofibres or nanotubes according to the prior art, the process according to the invention, which uses a specific ECR plasma, enables deposits to be formed on very large surfaces, greater than, for example, 1 $m^2$.

In the process according to the invention, a source of specific ECR plasma is used, which is a confining source, due to the implementation of a magnetic structure with a highly unbalanced magnetic mirror.

Furthermore, the ECR electronic cyclotron resonance zone, unlike most ECR plasma processes as described in Document (20) "Electron cyclotron resonance plasma in source for material depositions", M. Delaunay and E. Touchais (Review of Scientific Instruments, vol. 69, number 6, June 1998, pages 2320–2324), is located, according to the invention, within the interior of the deposition chamber itself, opposite the substrate, and is thus integrated with it, and there is therefore no separation between the ECR plasma reaction chamber and the deposition chamber.

Then, in the process according to the invention, the said ECR plasma source, specific and confining, is used at very low pressure, generally less than $10^{-4}$ mbar.

It is essentially the combination of this specific and confining ECR plasma source with this very low pressure that makes it possible, in the process according to the invention, to strongly dissociate the organic molecules in order to obtain films formed from webs of carbon nanofibres or nanotubes, or networks of interconnected carbon nanofibres or tubes, as in a spider's web.

The ECR plasma, created according to the invention, is a stationary, stable plasma that, once installed, persists and stabilises itself. Complete dissociation of the molecules is obtained, going up to the end of any possible dissociation. For example, methane can dissociate to give C° species.

More precisely, it can be said that it is the lifetime of the plasma particles that increases and not the lifetime of the plasma.

In other words, this notable magnetic confinement makes it possible to increase the lifetime of the ions and the electrons that remain trapped in the magnetic mirror at the centre of the deposition chamber and along the field lines. The level of dissociation and ionisation of the molecules in the plasma is thus increased with the following types of electron collisions:

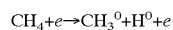
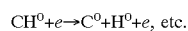

$CH_4 + e \rightarrow CH_3^+ + H^0 + e + e$ $CH_4 + e \rightarrow CH_3^0 + H^0 + e$ $CH^0 + e \rightarrow C^0 + H^0 + e$, etc.

The low pressure increases the energy of the electrons and reduces re-combination.

The deposited carbon is generally a graphite type carbon with a minority proportion of sp3 bonds and a majority proportion, for example greater than 80%, of sp2 bonds.

In a surprising manner, according to the invention, it has been noted that for a pressure that does not conform with the invention, in other words a pressure greater than $10^{-4}$ mbar, there is practically no growth of such carbon films but, on the other hand, the appearance of grains of graphite or diamond of various dimensions with, sometimes, cauliflower or lava cluster morphologies.

Films of carbon fibres, with the structure described above and without a catalyst, have never been obtained by the processes of the prior art.

Moreover, and according to an essential advantage of the process according to the invention, the structures of the web like films are obtained directly from an organic compound, without requiring a catalyst, such as a metal, for example nickel, cobalt or another metal.

The magnetic structure with a highly unbalanced magnetic mirror, according to the invention, is such that the magnetic mirror field is maximum ($B_{max}$) at the microwave injection, then the magnetic field is minimum ($B_{min}$) at the centre of the deposition chamber, and finally the magnetic field increases on the substrate ($B_{substrate}$).

In other words, it involves a strong magnetic mirror upstream at the injection and a weaker magnetic mirror downstream, in other words at the substrate level.

Advantageously, according to the invention the mirror ratio upstream, at the microwave injection, defined by $r_1 = B_{max}/B_{min}$ is greater than 4.

This high mirror ratio makes it possible to make ionised particles (ions and electrons) diffuse towards the substrate under the effect of a decreasing gradient.

Advantageously, the mirror ratio, downstream towards the substrate, defined by $r_2 = B_{substrate}/B_{min}$ is greater than or equal to 1.5, for example equal to around 1.5.

Preferably, according to the invention, the substrate is heated to a temperature of 500° C. to 750° C., and preferably 550° C. to 700° C., in order to provide the activation energy required for growth.

The substrate may be heated by electron bombardment or external heating; the electrons are those of the plasma, attracted by the substrate.

The substrate may be chosen from a wide variety of materials, whose deformation temperatures are greater than the operating temperature such as, for example, glass or silicon.

The substrate does not need to be a conductor. Whatever the case, it is the conductive carbon film that establishes the applied potential.

According to the invention, the pressure is maintained, preferably, at less than or equal to $8.10^{-5}$ mbar, in order to increase the energy of the electrons and reduce re-combination.

The gas containing carbon may contain carbon in any form whatever; any organic molecule is acceptable.

According to the invention, the gas containing carbon is, for example, methane, ethane, ethylene, acetylene and mixtures, possible supplemented with hydrogen, in any proportions.

Advantageously, the injection of the microwave power takes place at a frequency of 2.45 GHz, at a magnetic field value of B, corresponding to the ECR, around 875 Gauss for a methane type gas.

Generally, the substrate is positively polarised, for example from +20 volts to +100 volts, with a flow of electrons that favours growth without a catalyst, in accordance with the invention, with the plasma connected to frame.

Another possibility consists in polarising the plasma negatively, for example from −20 volts to −100 volts, with the substrate connected to frame.

The invention also concerns a device for electron cyclotron resonance plasma deposition of films of carbon nanofibre webs onto a substrate free of any catalyst, the said device comprising:

a deposition chamber the means for creating a magnetic structure with a highly unbalanced magnetic mirror in the said deposition chamber an electron cyclotron resonance zone within the interior of the said deposition chamber and opposite the said substrate the means for injecting a microwave power into the said deposition chamber the means for creating a pressure less than $10^{-4}$ mbar of a gas containing carbon within the interior of the said deposition chamber.

The device according to the invention may comprise, in addition, means for heating the substrate, if the substrate is not sufficiently heated by the electrons of the plasma bombarding the substrate.

The device according to the invention may also comprise, in addition, the means for creating a potential difference between the plasma and the substrate.

As has already be pointed out, the device according to the invention stands out from ECR plasma devices as in Document (20) mainly by the fact that there is no separation between the plasma creation chamber, the diffusion, and the deposition chamber, since the ECR zone is integrated within the deposition chamber.

The invention concerns, in addition, a film, which may be on a substrate, formed of a web or network of interconnected carbon nanofibres or nanotubes, like a spider's web, the said film being, moreover, free of any catalyst.

This type of web like film structure has never been obtained by processes of the prior art and may be prepared, for the first time, by the process of the invention without a catalyst, due to the use of a specific, confining ECR plasma source, and a low pressure of less than $10^{-4}$ mbar.

In other words, according to the invention, mono-architectures of carbon fibres or tubes are formed, which may be defined as webs ("nanowebs").

Unlike nanotubes created from catalytic nanograins, notably from metals, such as nickel, cobalt, etc., one obtains, according to the invention, without using any catalyst and, in a surprising manner, networks of interconnected carbon nanofibres, such as in a spider's web.

The structure of the films according to the invention is an ordered fibrous structure and not a random, unordered structure, as with the prior art, where the films are, besides, polluted and contaminated by the catalyst.

"Free of catalyst" is taken to mean that the films, according to the invention, do not include elements that could be defined as catalysts, these elements being mainly metals, such as nickel, cobalt, iron, or that these elements are present in trace quantities or as normal impurities.

More precisely, the films according to the invention are made up of nanosegments of carbon linked between each other by strong carbon bonds, which constitutes a different morphology to the carbon nanofibre or nanotube structures of the prior art.

According to the invention, the deposited carbon is graphite type carbon with a minority proportion of sp3 bonds and a majority proportion of sp2 bonds, for example greater than 80%.

"Nano-architecture" or "nanoweb" is generally taken to mean that the webs or networks of films according to the invention have an average mesh size of one or several tens of nm to several hundreds of nm, for example from 20 to 200 nm.

Preferably, the average mesh size is 100 nm.

In the same way, nanotubes or nanofibres is generally taken to mean that the diameter of the fibres or tubes is from one to several nm up to one or several tens of nm, for example from 1 to 100 nm, and preferably 20 nm.

The mesh size of the carbon fibre webs increases when the pressure of the gas, such as methane, is reduced, for example from $8.10^{-5}$ to $6.10^{-5}$ mbar.

The thickness of the films according to the invention is generally one or several nm to one or several tens of nm, for example from 1 to 100 nm.

The invention also concerns a structure with several layers (multi-layer structure) comprising at least two films of carbon nanofibre or nanotube webs according to the invention, which may be on a substrate.

This type of structure may comprise as many films as required by the application, and may have a thickness generally of from one or several tens of nm to one or several hundreds of nm, for example from 2 to 200 nm.

The structure on which the film or multi-layer structure described above is formed may be chosen from any of the substrates mentioned above; it could, for example, be glass, such a borosilicate glass or silicon.

It should be noted that, by extension, the films or structures according to the invention could also be called "webs".

The films according to the invention, formed from a web or network of carbon nanofibres or nanotubes have, in addition, apart from their specific structure, a certain number of excellent properties, which make them particularly suitable for a wide range of applications.

The web or fibre of carbon according to the invention is an electrical conductor and refractory, like graphite.

Thus, it generally withstands temperature greater than 700° C.

In addition, the mechanical strength of these films is excellent and these films are electron emitters under a field effect, at a field threshold of 10 to 20 V/$\mu$.

Moreover, the films are chemically inert at ambient temperature, like graphite.

Finally, for the first time, large areas of films or multi-layer structures, for example from 0.25 m² to 1 m² may be formed according to the invention, and without the use of catalysts.

The properties described above may be used to good benefit in numerous possible applications of films and multi-layer structures according to the invention, formed from a web or network of interconnected carbon nanofibres or nanotubes, like in a spider's web.

The invention thus concerns a filter, in particular a bacterial filter, or a virus filter, comprising at least one of the said films or the said multi-layer structures, which may be on a substrate or on a grid.

In fact, the average mesh size of the carbon nanofibre webs according to the invention corresponds to the best known bacterial filters. For further details, the reader may refer to the work by G. LEYRAL, J. FIGARELLA and M. TERRET, Microbiologie Appliqué, volume 2, J. LANORE publisher, p. 150 (liquids) and p. 174 (gases).

In particular, in the case of liquids, filters that can be used for the sterilised filtration of particles and bacteria whose size is greater than 0.2 $\mu$ can be made, 0.2 $\mu$ corresponding to the size of the smallest bacteria.

The filters according to the invention will therefore be defined as bacterial filters. For certain films, the filters according to the invention could filter viruses.

The films or multi-layer structures according to the invention may, in an advantageous manner, have a large surface. This property is particularly profitably employed in filtration, where large filtration surfaces have to be available for use.

In the filters according to the invention, the film or multi-layer structure is spread out on a rigid mesh, for example a metal mesh, with larger mesh size, for example several hundreds of $\mu$, in order to allow filtration.

The invention also concerns electron accelerator or decelerator nanogrids comprising at least one film or at least one multi-layer structure according to the invention. The conductive and refractory properties of the films according to the invention are exploited in such nanogrids.

Moreover, the invention concerns a flat screen, in particular a large size flat screen, which comprises at least one film or at least one multi-layer structure according to the invention, which may be on a substrate. The fact that these films or structures emit electrons by field effect and can thus advantageously replace the metallic microdots presently used in flat screens may thus be exploited.

The applications given above are only some examples of the applications of the films and structures according to the invention, which may be applied in all fields where their properties, in particular their mechanical strength, may be profitably employed.

DETAILED DESCRIPTION OF THE PREFERRED EMBODIMENT

Figure 1:
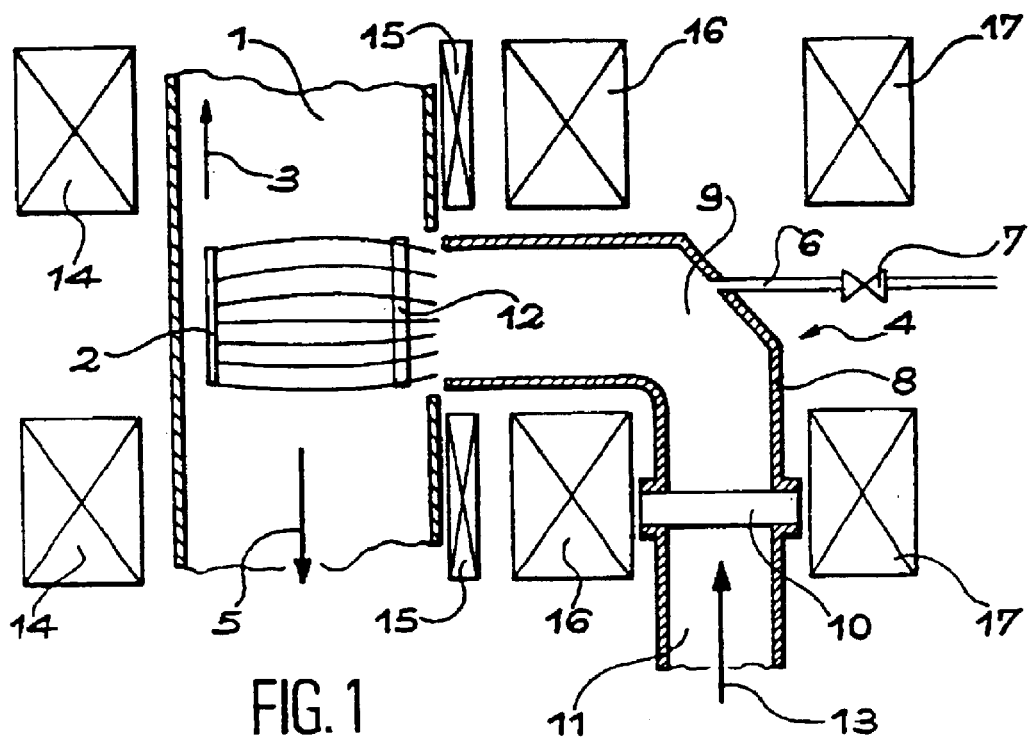
FIG. 1 illustrates an electron cyclotron resonance plasma source with rectangular coils for the implementation of the process according to the invention, with the substrate advantageously unwinding along one dimension.

In a more detailed manner, the process according to the invention may be implemented, for example, with the device as described in FIG. 1.

This device comprises essentially a deposition chamber (1) in which there is a substrate (2).

This substrate (2) may be driven, for example, by a translational rectilinear displacement (3). The substrate (2) may be polarised, negatively, positively or connected to frame.

Preferably, the substrate is positively polarised, generally from +20 to +100 volts, as this type of positive polarisation makes it possible to complete the dissociation of the organic molecules on the substrate.

The substrate generally has a flat shape and a size of 0.25 m² to 1 m² which is, as has been seen, one of the advantages of the invention which allows films of carbon fibres to be deposited on relatively large surfaces, for example on substrates from 0.25 m² to 1 m² and more, which is particularly interesting for making large size flat screens. The substrate is, for example, glass, such as a borosilicate type glass or silicon.

The substrate on which the films of carbon fibre are deposited may, also, preferably, be made out of a material that can be dissolved in an operation following the deposition operation, and the films of carbon fibre, thus separated from the initial substrate, are then spread out on a rigid mesh, for example, with larger mesh size, for example, made out of metal or alloy, such as tungsten or stainless steel, in the case where the web of carbon fibres is to be used as a bacterial filter.

The deposition chamber or enclosure (1) receives the power generated by one or several microwave emitters (arrow 13), via a coupler (4), which spreads out this power in the deposition chamber or enclosure.

This injection of microwave power into the enclosure produces the ionisation of a gas containing carbon under low pressure.

According to the invention, this low pressure is, as has already been indicated above, a pressure less than $10^{-4}$ mbar and preferably $8.10^{-5}$ mbar.

The low pressure within the deposition enclosure or chamber is maintained through pumping, represented by the arrow (5).

The gas containing carbon is, for its part, introduced upstream, in the coupler, for example via a pipe (6) fitted with an adjustment valve (7).

The gas is chosen, for example, from methane, ethane, ethylene, acetylene and their mixtures, possible mixed with hydrogen.

The coupler (4) comprises a microwave injection guide (8) ending in an elbow (9), which forms an angle of 90°, and which is connected to the deposition chamber or enclosure (1) perpendicular to it.

A microwave seal (10), for example made out of quartz, is placed in the wave guide between the admission wave guide (11) and the said 90° elbow (9).

This seal ensures the separation between the admission or injection guide (11) in which there is air at atmospheric pressure, and the elbow, as well as the deposition chamber or enclosure, which are under vacuum thanks to the pumping.

Due to the configuration described above, the microwave injection and the seal (10) are situated at 90° to the axis of the device, which makes it possible to avoid the seal being covered with carbon and ensures that the device operates in a continuous manner.

In accordance with the invention, the electron cyclotron resonance zone, represented by the reference (12) in FIG. 1, is within the deposition chamber or enclosure itself and is opposite the substrate.

As a result, in the device of the invention, there is no separation between the plasma creation chamber (ECR), the diffusion and the deposition chamber, since, according to the invention, the ECR zone is integrated into the deposition chamber.

According to the invention, the microwave power is injected into a specific magnetic structure with a highly unbalanced magnetic mirror and comprising the electron cyclotron resonance zone (12), positioned as indicated above, within the deposition chamber (1) itself, which causes a dissociation and/or ionisation of the molecules making up the gas containing carbon, and produces species that are deposited on the said substrate.

The electron cyclotron resonance (ECR) magnetic field may be produced by conductor windings, such as coils or solenoids with a rectangular, square or A cylindrical shape, or by permanent magnets.

In FIG. 1, the magnetic field coils are rectangular magnetic field coils (14, 15, 16, 17).

The size of the deposition depends mainly on the area of the electron cyclotron resonance (ECR) magnetic field that is created. In the case of rectangular magnetic field coils (14, 15, 16, 17), shown in FIG. 1, it is possible, for example, to obtain a plasma height of 25 cm, which can be extended to 1meter.

Figure 2:
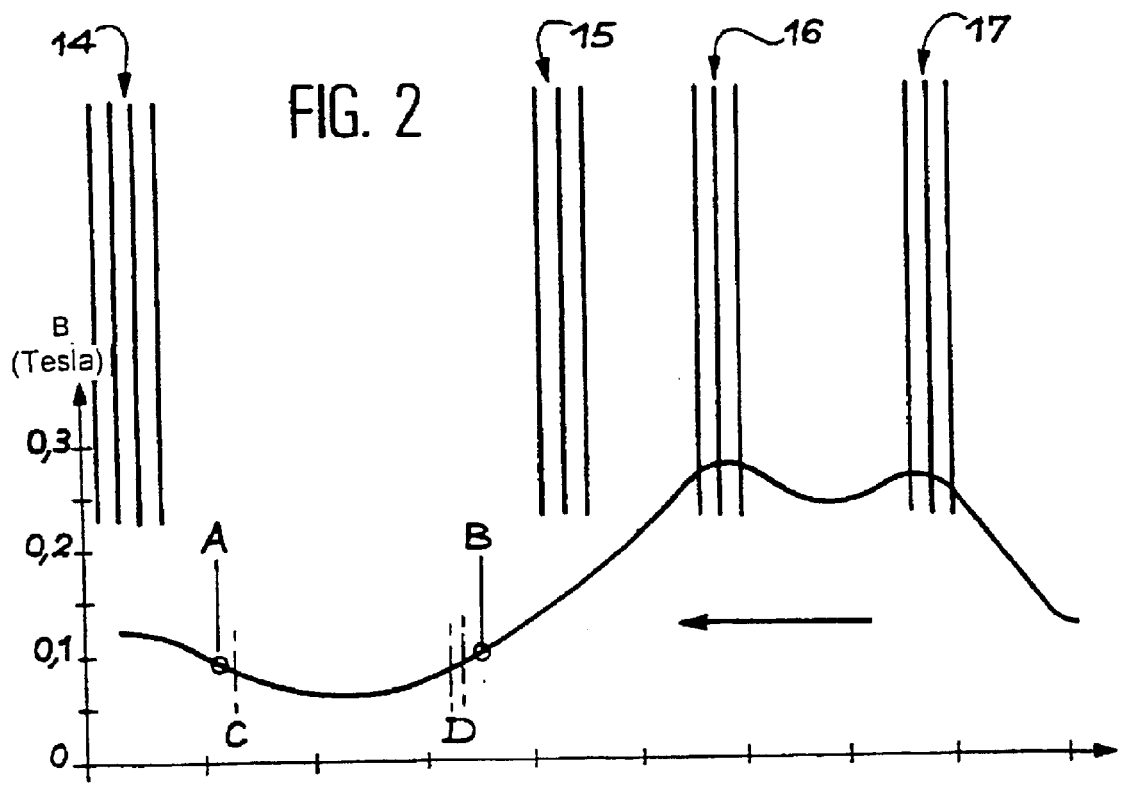
FIG. 2 shows the profile of the axial magnetic field of the plasma source.

According to the invention, the magnetic field created has a particular shape, forming a magnetic structure with a highly unbalanced magnetic mirror. Thus, the shape of the axial magnetic filed created in the device in FIG. 1 is represented in FIG. 2, which gives the value of the axial magnetic field B (in Tesla) at various points located on the axis of the deposition device; the abscissa represents a scale of length, with each graduation representing 10 cm.

In this figure, all of the vertical lines at the top of the graph represent the position of the rectangular magnetic field coils (14, 15, 16, 17) respectively supplied by currents of 370A, 370A, 900a and 900A.

In fact, according to the invention, it is the profile of the field that is important. To obtain this profile, the coils are supplied with currents in order to obtain the appropriate fields. For example, coils 14 and 15 are supplied with 370 A to give a field B=600 G, and coils 16 and 17 are supplied with 900 A to give a field B =2 700 G.

In this case, the desired ratios given above, i.e. $r_1$ >4 and $r_2$ >1.5, are indeed obtained.

On the curve representing the axial magnetic field are shown the positions of the deposition chamber, which is located between points A and B, the position of the substrate (point C), and the position of the electron cyclotron resonance (ECR) zone, represented by segment D. The arrow indicates the direction of the microwave injection and the injection of gas.

It can be seen that the magnetic field is at a maximum and high at the microwave injection, where it has a value, for example, of 2 700 G, the magnetic field is at a minimum, for example, of 600 G at the centre of the deposition chamber, and that the magnetic field then increases on the substrate.

One thus obtains a strong magnetic mirror at the injection point and a lower one downstream.

Typically, the injection mirror ratio $r_1$ is greater than 4.

Thus, in the case of the device shown in FIG. 1, $r_1$ =$B_{max}/B_{min}$ =2 700 G/600 G=4.5.

This high mirror ratio r, makes it possible to diffuse the ionised particles, ions and electrons, towards the substrate under the effect of the decreasing gradient.

Typically, the mirror ratio $r_2$ downstream, towards ru the substrate, is at least 1.5.

Thus, in the case of the device shown in FIG. 1, $r_2$ =$B_{substrate}/B_{min}$=900 G/600 G=1.5.

As has already been indicated above, the notable magnetic confinement, according to the invention, makes it possible to increase the lifetime of the ions and electrons, which remain trapped in the magnetic mirror at the centre of the deposition chamber and along the field lines.

The level of dissociation and ionisation of the molecules in the plasma are thus increased with the following types of electron collisions:

$$CH_4 + e \rightarrow CH_3^+ + H^0 + e + e$$

$$CH_4 + e \rightarrow CH_3^{0+} H^0 + e$$

$$CH^0 + e \rightarrow C^0 + H^0 + e, \text{ etc.}$$

The invention will now be described, in referring to the following examples, which are given by way of indication and are in no way limiting.

EXAMPLES

According to the invention, nanowebs of carbon fibres or tubes are deposition on various substrates without any catalyst. The device used is more or less the same as that shown in FIG. 1.

Example 1

In this example, the gas used is methane and the substrate is silicon heated to 640° C.

The pressure within the deposition chamber or enclosure is $6.10^{-5}$ mbar.

In this way, multi-layers of a web or network of interconnected carbon nanofibres or nanotubes with a fibre diameter of around 20 nm are obtained, which are like a spider's web, and whose average mesh size is less than 200 nm.

Figure 3A:
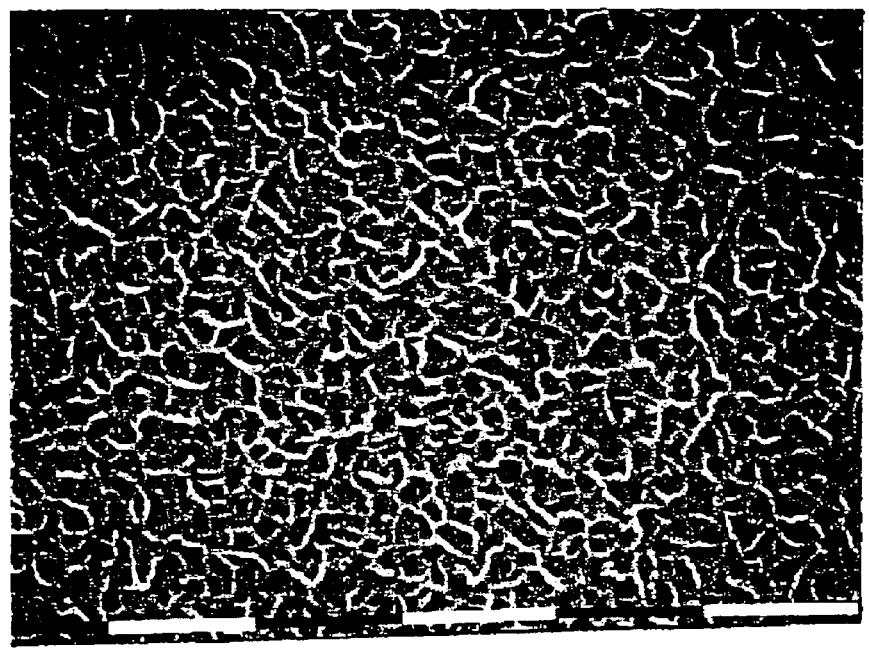
FIGS. 3A and 3B are photographs taken by a scanning electron microscope (SEM) of multi-layers of carbon nanofibre webs deposited on a silicon substrate by the process according to the invention. One graduation represents 1 $\mu$.
Figure 3B:
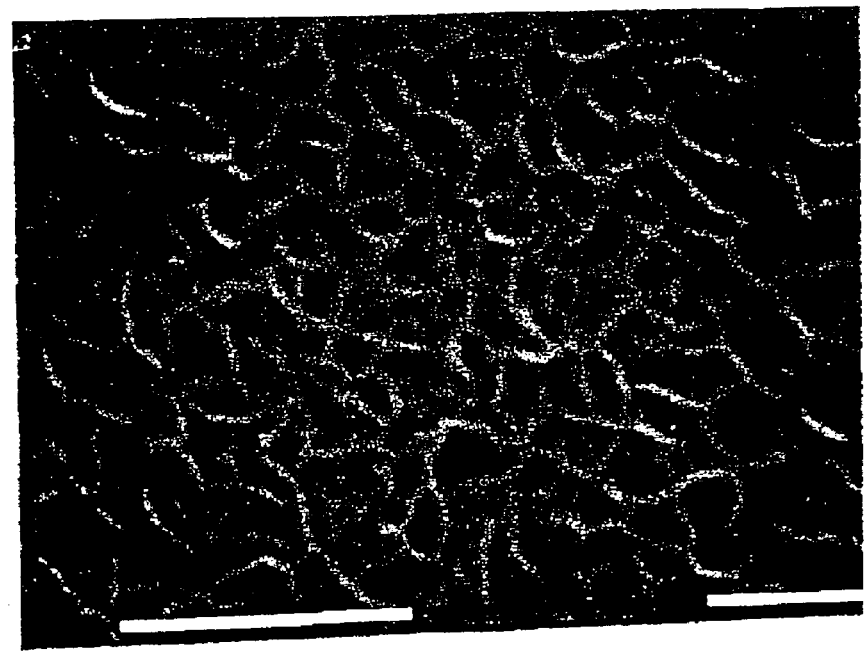

FIGS. 3A and 3B are scanning electron microscope (SEM) photographs of such multi-layers.

Figure 5:
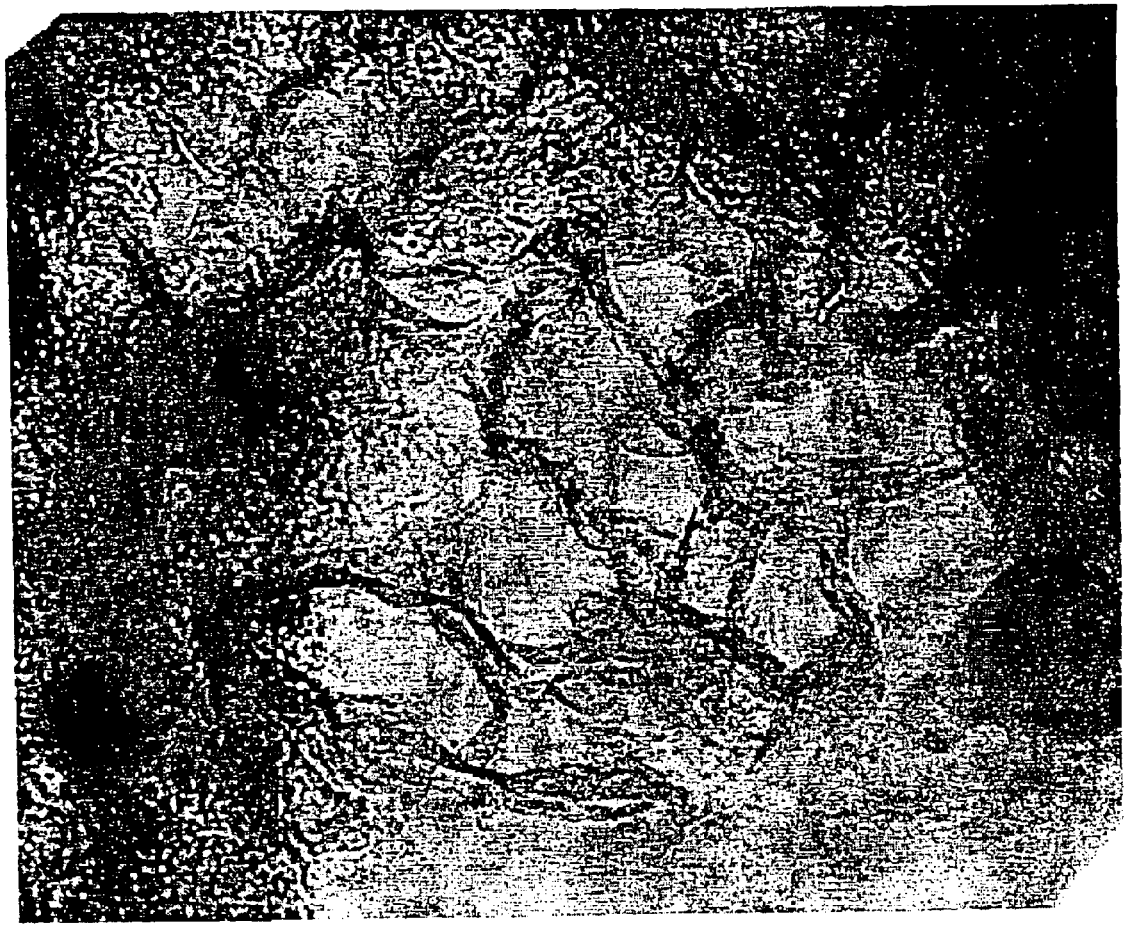
FIG. 5 is a photograph taken by a scanning electron microscope (SEM) of a single layer of carbon nanofibres deposited on a borosilicate glass substrate by the process according to the invention. One graduation represents 100 nm.

We have also removed a film (single layer) from the multi-layer deposit and spread it out on the grid of a transmission electron microscope (TEM): this type of operation highlights the solidity of the films obtained by the process according to the invention. The transmission electron microscope (TEM) photograph of the single layer is shown in FIG. 5.

Example 2

In this example the gas used is methane and the substrate is borosilicate glass heated to 680° C.

The pressure within the deposition chamber or enclosure is $8.10^{-5}$ mbar.

One thus obtains, in the same way as in Example 1, multi-layers of a web or network of interconnected carbon nanofibres or nanotubes with a fibre diameter of around 20 nm are obtained, which are like a spider's web, and whose average mesh size is near, or less than, 100 nm.

Figure 4A:
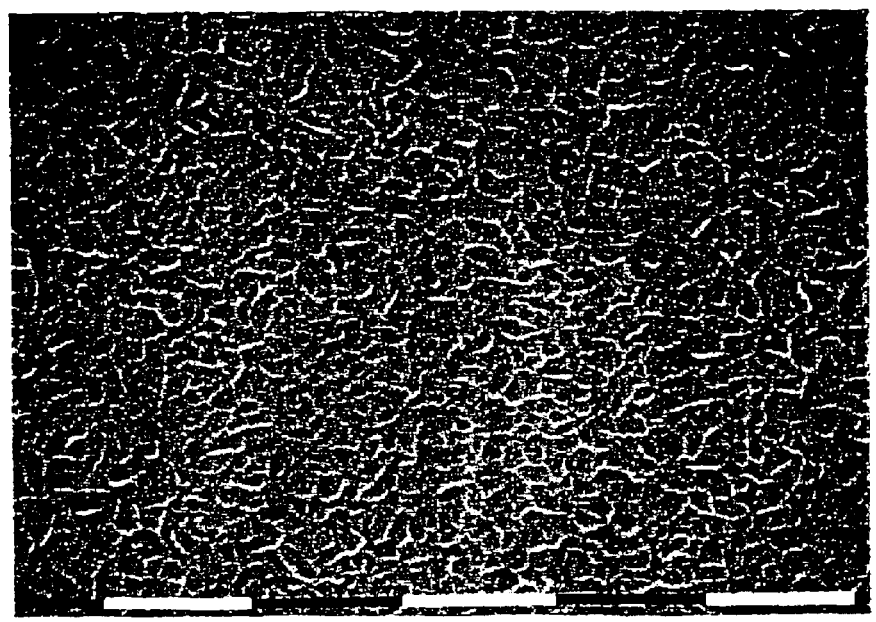
FIGS. 4A and 4B are photographs taken by a scanning electron microscope (SEM) of multi-layers of carbon nanofibre webs deposited on a borosilicate glass substrate by the process according to the invention. One graduation represents 1 $\mu$.
Figure 4B:
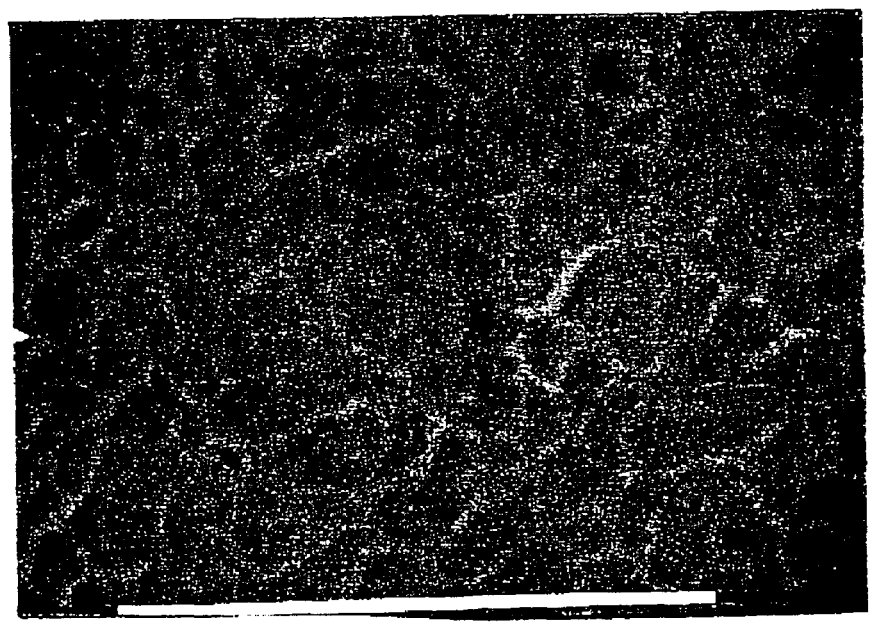

FIGS. 4A and 4B are scanning electron microscope (SEM) photographs of such multi-layers.

Apart from these SEM analyses and, if appropriate TEM analyses, other analyses may also be carried out. The results of all of the analyses carried out on the multi-layers or single layers in Example 1 and 2 are as follows:

Composition: carbon (several % of hydrogen were identified) (determined by ERDA—Elastic Recoil Detection Analysis)

TEM: diffraction photographs: the distance d (hkl) observed is 3.47 A, which corresponds more to a nanotube type structure (d=3.44 A) than crystals of flat graphite (d=3.35 A).

It should be noted that the nanotubes are rolled up and concentric films with hexagonal carbon cycles, as in graphite (whose films remain flat).

SEM: multi-layers of nanoweb with a fibre diameter of around 20 nm (see FIGS. 3A, 3A, 4A and 4B).

XPS (X-ray photoelectron spectroscopy): around 80% of sp2 bonds (flat or rolled up graphite).

Material that is a good electrical conductor like graphite

X-ray analysis: graphite structure

Raman spectroscopy (optical method with a laser): graphite structure.

Temperature resistance: above 700° C.

Chemically inert at ambient temperature, like graphite.

TABLE I

Examples of carbon film deposits

| Device | Ref. | Process | Substrate temperature (° C.) | Pressure (mbar) | % gas | Field threshold emission (V/μ) | Substrate polarisation (V) |
|---|---|---|---|---|---|---|---|
| DIAMOND | | | | | | | |
| Hot filament | (1) | CVD (chemical vapour deposition) | 800 to 1000 | 30 to 50 | 1% $CH_4$/$H_2$ | 20 | |
| Microwave | (2) | CVD | 800 | | 1% $CH_4$/$C_2H_5OH$ | 22 to 50 | |
| Microwave | (3) | CVD | 650 to 1100 | 20 to 100 | 0.5 to 3% $CH_4$ | | 0 to −300 |
| ECR | (4) | CVD | 300 to 500 | $2 \times 10^{-2}$ to 2 | $CH_3OH$ or 0.5% $CH_4$ | | +30 |
| RF (or radio frequency) | (5) | CVD | 700 to 1200 | 20 to 30 | 0.2 to 1% $CH_4$/$H_2$ | | |
| DLC (Diamond like carbon) | | | | | | | |
| Arc | (6) | $C^+$ ions | 20 | P ↓ | Without | 10 | 0 to −350 |
| RF | (7) | PECVD | 20 | $10^{-3}$ to $3 \times 10$ | $CH_4$ or 10% $CH_4$ with He | 5 to 20 | −100 |

TABLE I-continued

Examples of carbon film deposits

| Device | Ref. | Process | Substrate temperature (° C.) | Pressure (mbar) | % gas | Field threshold emission (V/μ) | Substrate polarisation (V) |
|---|---|---|---|---|---|---|---|
| Ion source | (8) | Bombardment of carbon by CO$^+$ ions | 20 | | | 17 | |
| Laser | (9) | Ablation → carbon plasma | 20 | | | 10 | |
| ECR | (10) | CVD | 20 to 100 | $10^{-3}$ to $10^{-2}$ | 20% to 100% CH$_4$ | | −50 to −500 |
| Graphite | | | | | | | |
| ECR | (11) | CVD | 400 to 600 | $6 \times 10^{-4}$ | CH$_4$ or 10–50% H$_2$ | 10 to 30 | +100 |
| Microwaves | (12) | CVD | 800 | 40 | 1% CH$_4$ 99% H$_2$ | 5 | |
| Soot | (13) | Soot bonding | 20 | | | 20 | |
| Electrical discharge | (14) | CVD nanotubes | 900 | | CH$_4$ | | |

What is claimed is:

1. Process for depositing, by electron cyclotron resonance plasma, a web of carbon nanofibres or nanotubes onto a substrate without any catalyst, comprising:

injecting of a microwave power into a deposition chamber having a magnetic structure with an unbalanced magnetic mirror and at least one electron cyclotron resonance zone within an interior of the deposition chamber itself and opposite the substrate;

inducing under a pressure less than or equal to $10^{-4}$ mbar, at least one of ionization and dissociation of a gas containing carbon in the magnetic mirror in a center of the deposition chamber and producing species that deposit on the substrate, which is heated.

2. Process according to claim 1, comprising the following steps:

heating the substrate;

establishing said pressure less than or equal to $10^{-4}$ mbar of a gas containing carbon;

injecting the microwave power, and creating the plasma from the gas containing carbon, for a value of the magnetic field corresponding to the electron cyclotron resonance;

creating a potential between the plasma and the substrate;

at least one of dissociating and ionizing molecules in the magnetic mirror at the center of the deposition chamber; and depositing the species formed on the substrate in order to obtain a web of carbon nanofibres or nanotubes.

3. Process according to claim 2, in which the steps of heating, establishing, injecting, creating, at least one of dissociating and ionizing and depositing are carried out simultaneously.

4. Process according to claim 1, in which the deposited carbon is a graphite type carbon with a minority proportion of sp$^3$ bonds and a majority proportion of sp$^2$ bonds.

5. Process according to claim 1, in which the structure of the magnetic mirror is such that a magnetic field is maximum ($B_{max}$) at microwave injection, the magnetic field is minimum ($B_{min}$) at the center of the deposition chamber, and the magnetic field increases on the substrate ($B_{substrate}$).

6. Process according to claim 1, in which a mirror ratio upstream at the microwave injection, defined by $r_1 = B_{max}$ (in Gauss)/$B_{min}$ (in Gauss), is greater than 4.

7. Process according to claim 1, in which a mirror ratio, downstream towards the substrate, defined by $r_2 = B_{substrate}$ (in Gauss)/$B_{min}$ (in Gauss), is greater than or equal to 1.5.

8. Process according to claim 1, in which the substrate is heated to a temperature of 500° C. to 750 ° C.

9. Process according to claim 1, in which the pressure is less than or equal to $8 \times 10^{-5}$ mbar.

10. Process according to claim 1, in which the gas containing carbon is chosen from methane, ethane, ethylene, acetylene, and their mixtures, possibly supplemented with hydrogen.

11. Process according to claim 1, in which the heating of the substrate is achieved by electron bombardment or external heating.

12. Process according to claim 1, in which the injection of the microwave power takes place at a frequency of 2.45 GHz.

13. Process according to claim 1, in which the substrate is positively polaized, and the plasma is connected to an electrical ground.

14. Process according to claim 13, wherein said substrate is positively polarized from +20 volts to +100 volts.

15. Process according to claim 1, in which the plasma is negatively polarized, preferably from −20 to −100 volts, and the substrate is connected to an electrical ground.

16. Process according to claim 15, wherein said plasma is negatively polarized from −20 volts to −100 volts.

17. Process according to claim 1, wherein said unbalanced magnetic mirror is configured to trap ions and electrons in the center of the deposition chamber.

* * * * *